United States Patent
Satoh et al.

[11] Patent Number: 6,147,565
[45] Date of Patent: Nov. 14, 2000

[54] PIEZO-OSCILLATOR WITH HEATER AND TEMPERATURE CONTROL CIRCUIT

[75] Inventors: Tomio Satoh; Tetsuya Abe, both of Kouza-gun, Japan

[73] Assignee: Toyo Communication Equipment Co., Ltd., Kanagawa, Japan

[21] Appl. No.: 09/367,691

[22] PCT Filed: Jan. 18, 1999

[86] PCT No.: PCT/JP99/00128

§ 371 Date: Aug. 18, 1999

§ 102(e) Date: Aug. 18, 1999

[87] PCT Pub. No.: WO99/37018

PCT Pub. Date: Jul. 22, 1999

[30] Foreign Application Priority Data

Jan. 20, 1998 [JP] Japan .................................. 10-023920
Jun. 19, 1998 [JP] Japan .................................. 10-172571

[51] Int. Cl.[7] .............................. H01L 41/08; H03B 5/32; H03L 1/02
[52] U.S. Cl. ............................ 331/70; 331/158; 331/176; 219/210; 310/343
[58] Field of Search ................................. 331/69, 70, 158, 331/176; 219/210; 310/341, 343, 344

[56] References Cited

U.S. PATENT DOCUMENTS

| 5,917,272 | 6/1999 | Clark et al. .............................. 310/343 |
| 6,049,256 | 4/2000 | Fry ............................................ 331/69 |
| 6,060,692 | 5/2000 | Bartley et al. ........................... 219/210 |

FOREIGN PATENT DOCUMENTS

| S50-20831 | 7/1975 | Japan . |
| S56-117404 | 9/1981 | Japan . |
| H1-146618 | 10/1989 | Japan . |
| H8-237031 | 9/1996 | Japan . |

*Primary Examiner*—Siegfried H. Grimm
*Attorney, Agent, or Firm*—Koda & Androlia

[57] ABSTRACT

There are disposed on a printed substrate a crystal resonator as a piezoelectric resonator, an oscillation circuit, a plurality of surface mount heaters and a temperature controlling circuit for controlling a heating temperature of the heaters. A case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time. Accordingly, it is possible to provide a piezo-oscillator excellent in low power consumption and compactness.

12 Claims, 5 Drawing Sheets

PIEZO-OSCILLATOR WITH HEATER AND TEMPERATURE CONTROL CIRCUIT

BACKGROUND OF THE INVENTION

1. Field of the Invention

The present invention relates to a piezo-oscillator, and relates, more particularly, to a piezo-oscillator with an oscillation frequency of high stability.

2. Description of Related Art

A frequency of high stability has been required as a reference signal generation source in the fields of electrical machinery and apparatus such as frequency counters used for the maintenance of communication facilities in mobile communication base stations and satellite communication apparatuses, etc.

Accordingly, as a reference signal generation source, an oven controlled crystal oscillator is used having a frequency stability of about $1 \times 10^{-7}$ to $1 \times 10^{-10}$.

Further, in recent years, compact and light-weight portable apparatuses have been required in these fields, and accordingly, compact and light-weight properties have also been required in an oven controlled crystal oscillators.

An oven controlled crystal oscillator is comprised of a crystal resonator within a recess of a metal block having a large heat capacity for obtaining a highly stable oscillation frequency, and heating the metal block at a predetermined temperature of a constant level.

FIG. 5 is a partially cross-sectional perspective view for showing one example of a conventional oven controlled crystal oscillator.

As shown in the drawing, a recess 100a is formed in a metal block 100 made of a metal such as aluminum or the like, and a crystal resonator 101 is provided within the recess 100a.

A lead terminal of this crystal resonator 101 is connected to a substrate 102 on which an oscillation circuit is structured, by solder or the like.

A heating wire 103 for heating the metal block 100 is wound around the outer periphery of the metal block 100, and a semiconductor element 104 such as a transistor or the like is also closely adhered to the outer periphery of the metal block, for controlling power conduction of the heating wire 103.

With this arrangement, it is possible to utilize the semiconductor element 104 as an auxiliary heat source, and the characteristics of the semiconductor 104 can be stabilized by heating the semiconductor element 104 at a constant temperature by the heating wire 103.

Reference numeral 105 denotes a temperature sensor such as a thermistor or the like for detecting the temperature inside the metal block 100. Reference numeral 106 denotes a substrate on which a temperature control circuit is provided for controlling a heating temperature together with the semiconductor element 104 based on temperature information from the temperature sensor 105.

Reference numeral 107 denotes a metal vessel made of aluminum or the like, and a heat insulating material 108 is filled in the space within the metal vessel 107.

The oven controlled crystal oscillator having the above-described structure can make the heating wire 103 generate heat based on a control signal from the temperature control circuit 106 to heat the metal block 100 and the crystal resonator 101 at a specific constant temperature, so that it is possible to output a highly stable frequency signal.

However, the crystal resonator as shown in FIG. 5 has a problem that as it is necessary to use the metal block 100 having a predetermined heat capacity for holding the crystal resonator 101 at a constant temperature, manufacturing cost of the oscillator increases and the size of the oscillator becomes larger.

Further, as the substrate 102 has an extremely lower heat capacity as compared with the metal block 100, the substrate 102 is easily subjected to the influence of variations in the outer temperature. As the heat of the crystal resonator 101 is discharged to the lead terminal of the crystal resonator 101 and the substrate 102 connected to this lead terminal, the temperature of the crystal resonator varies according to the variation of the outer temperature, resulting in an unstable oscillation frequency.

The heating wire 103 starts heat generation after the power supply has been turned on, and the heat from the heating wire 103 is transmitted from the metal block 100 to a crystal blank via a long transmission route through a metal cap of the crystal resonator. Accordingly, it takes a long time until the temperature of the crystal resonator is stabilized. This causes a problem that it takes a long time from when the power supply voltage is turned on until when the oscillation frequency is stabilized, and that the power required for the heating becomes larger as the heat capacity of the metal block is large, so that low power consumption of the oven controlled crystal oscillator cannot be achieved.

The present invention has been made to solve the above-described problems, and it is an object of the present invention to provide a piezo resonator which can be manufactured in compact at low cost and which is excellent in starting characteristics, short starting time characteristics and low power consumption.

DISCLOSURE OF THE INVENTION

In order to achieve the above object, according to a first aspect of the present invention, there is provided a piezo-oscillator having disposed on a printed substrate a piezoelectric resonator, an oscillation circuit, at least one surface mount heater and a temperature controlling circuit for controlling a heating temperature of the heater, wherein a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time.

According to a second aspect of the invention, there is provided a piezo-oscillator having disposed on a printed substrate a piezoelectric resonator, an oscillation circuit, at least one heater and a temperature controlling circuit for controlling a heating temperature of the heater, wherein the temperature controlling circuit is equipped with a temperature sensitive element and a DC control transistor; a wide-area land pattern for connecting a collector terminal of the transistor is provided on a first main surface of the printed substrate; and at least the transistor, the heater and the temperature sensitive element are disposed on the first main surface of the printed substrate; with the piezoelectric resonator being disposed to cover both the temperature sensitive element and the heater; and with the piezoelectric blank and the land pattern being connected together via a heat conductive member disposed therebetween.

According to a third aspect of the invention, there is provided a piezo-oscillator having disposed on a printed substrate a piezoelectric resonator, an oscillation circuit, at least one heater and a temperature controlling circuit for controlling a heating temperature of the heater, wherein the temperature controlling circuit is equipped with a temperature sensitive element and a DC control transistor; a wide-area land pattern for connecting a collector terminal of the transistor is provided on a first main surface of the printed substrate; at least the transistor, the heater and the temperature sensitive element are disposed on the first main surface of the printed substrate; and a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time; with the piezoelectric resonator and the land pattern being connected together via a heat conductive member disposed therebetween.

According to a fourth aspect of the invention, there is provided a piezo-oscillator having disposed on a printed substrate a piezoelectric resonator, an oscillation circuit, at least one surface mount heater and a temperature controlling circuit for controlling a heating temperature of the heater, wherein a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time; and a rate of power supply to the individual heaters is set to stabilize the oscillation frequency of the oscillator according to a difference of heat capacity of the piezoelectric resonator.

According to a fifth aspect of the invention, there is provided a piezo-oscillator having disposed on a printed substrate a piezoelectric resonator, an oscillation circuit, at least one heater and a temperature controlling circuit for controlling a heating temperature of the heater, wherein the temperature controlling circuit is equipped with a temperature sensitive element and a DC control transistor; a rate of power supply to the individual heaters is set to stabilize the oscillation frequency of the oscillator according to a difference of heat capacity of the piezoelectric resonator; a wide-area land pattern for connecting a collector terminal of the transistor is provided on a first main surface of the printed substrate; and at least the transistor, the heater and the temperature sensitive element are disposed on the first main surface of the printed substrate; with the piezoelectric resonator being disposed to cover both the temperature sensitive element and the heater; and with the piezoelectric element and the land pattern being connected together via a heat conductive member disposed therebetween.

According to a sixth aspect of the invention, there is provided a piezo-oscillator having disposed on a printed substrate a piezoelectric resonator, an oscillation circuit, at least one surface mount heater and a temperature controlling circuit for controlling a heating temperature of the heater, wherein the temperature controlling circuit is equipped with a temperature sensitive element and a DC control transistor; a rate of power supply to the individual heaters is set to stabilize the oscillation frequency of the oscillator according to a difference of heat capacity of the piezoelectric resonator; a wide-area land pattern for connecting a collector terminal of the transistor is provided on a first main surface of the printed substrate; at least the transistor, the heater and the temperature sensitive element are disposed on the first main surface of the printed substrate; and a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time; with the piezoelectric blank and the land pattern being connected together via a heat conductive member disposed therebetween.

According to a seventh aspect of the invention, there is provided a piezo-oscillator having disposed on a printed substrate a piezoelectric resonator, an oscillation circuit, at least one surface mount heater and a temperature controlling circuit for controlling a heating temperature of the heater, wherein the temperature controlling circuit is equipped with a temperature sensitive element and a DC control transistor; a wide-area land pattern for connecting a collector terminal of the transistor is provided on a first main surface of the printed substrate; at least the transistor, the heater and the temperature sensitive element are disposed on the first main surface of the printed substrate; with the piezoelectric resonator being disposed to cover both the temperature sensitive element and the heater; and with the piezoelectric resonator and the land pattern being connected together via a metal plate and a heat conductive member disposed therebetween.

According to an eighth aspect of the invention, there is provided a piezo-oscillator having disposed on a printed substrate a piezoelectric resonator, an oscillation circuit, at least one heater and a temperature controlling circuit for controlling a heating temperature of the heater, wherein the temperature controlling circuit is equipped with a temperature sensitive element and a DC control transistor; a wide-area land pattern for connecting a collector terminal of the transistor is provided on a first main surface of the printed substrate; and at least the transistor, the heater and the temperature sensitive element are disposed on the first main surface of the printed substrate; and a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time; with the piezoelectric element and the land pattern being connected together via a metal plate and a heat conductive member disposed therebetween.

According to a ninth aspect of the invention, there is provided a piezo-oscillator having disposed on a printed substrate a piezoelectric resonator, an oscillation circuit, at least one heater and a temperature controlling circuit for controlling a heating temperature of the heater, wherein the temperature controlling circuit is equipped with a temperature sensitive element and a DC control transistor; a rate of power supply to the individual heaters is set to stabilize the oscillation frequency of the oscillator according to a difference of heat capacity of the piezoelectric resonator; a wide-area land pattern for connecting a collector terminal of the transistor is provided on a first main surface of the printed substrate; and at least the transistor, the heater and the temperature sensitive element are disposed on the first main surface of the printed substrate; with the piezoelectric resonator being disposed to cover both the temperature sensitive element and the heater; and with the piezoelectric element and the land pattern being connected together via a metal plate and a heat conductive member disposed therebetween.

According to a tenth aspect of the invention, there is provided a piezo-oscillator having disposed on a printed substrate a piezoelectric resonator, an oscillation circuit, at least one heater and a temperature controlling circuit for controlling a heating temperature of the heater, wherein the temperature controlling circuit is equipped with a temperature sensitive element and a DC control transistor; a rate of power supply to the individual heaters is set to stabilize the oscillation frequency of the oscillator according to a difference of heat capacity of the piezoelectric resonator; a wide-area land pattern for connecting a collector terminal of the transistor is provided on a first main surface of the printed substrate; and at least the transistor, the heater and the temperature sensitive element are disposed on the first main surface of the printed substrate; and a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time; with the piezoelectric element and the land pattern being connected together via a metal plate and a heat conductive member disposed therebetween.

According to an eleventh aspect of the invention, there is provided a piezo-oscillator having disposed on a printed substrate a piezoelectric resonator, an oscillation circuit, at least one surface mount heater and a temperature controlling circuit for controlling a heating temperature of the heater, wherein a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time; with a heat conductive member filled between the piezoelectric element and the printed substrate.

According to a twelfth aspect of the invention, there is provided a piezo-oscillator having disposed on a printed substrate a piezoelectric resonator, an oscillation circuit, at least one surface mount heater and a temperature controlling circuit for controlling a heating temperature of the heater, wherein a case of the piezoelectric resonator and a lead terminal of the piezoelectric resonator are heated respectively at the same time by individually separate heaters for the purpose of heating the piezoelectric resonator,.the oscillation circuit and the temperature controlling circuit at the same time; and a rate of power supply to the individual heaters is set to stabilize the oscillation frequency of the oscillator according to a difference of heat capacity of the piezoelectric resonator; with a heat conductive member filled between the piezoelectric element and the printed substrate.

DETAILED DESCRIPTION OF THE PREFERRED EMBODIMENTS

The present invention will be explained in detail below with reference to the attached drawings.

Figure 1A:
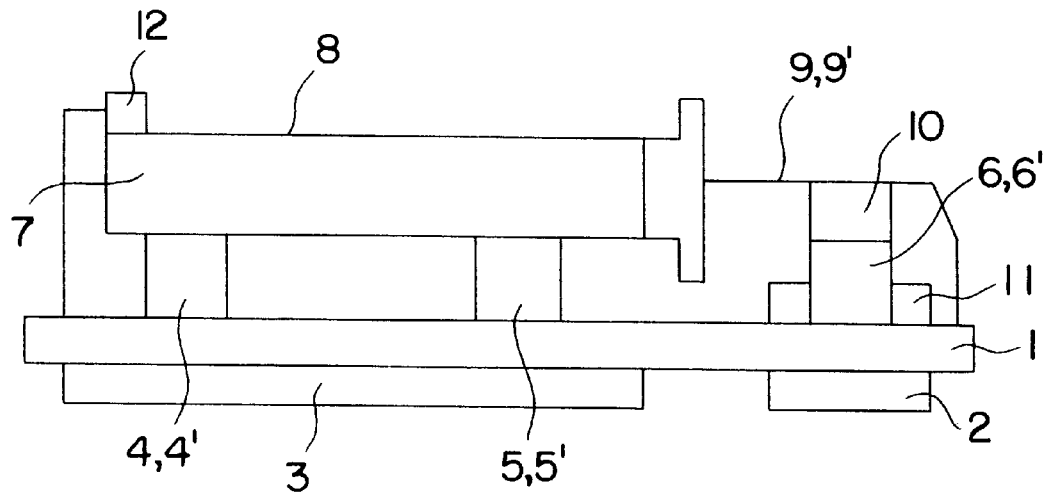
FIG. 1 (a) is a cross-sectional view for showing a side configuration of one embodiment of a crystal resonator based on the present invention, and FIG. 1 (b) is a top plan view for showing the same configuration.
Figure 1B:
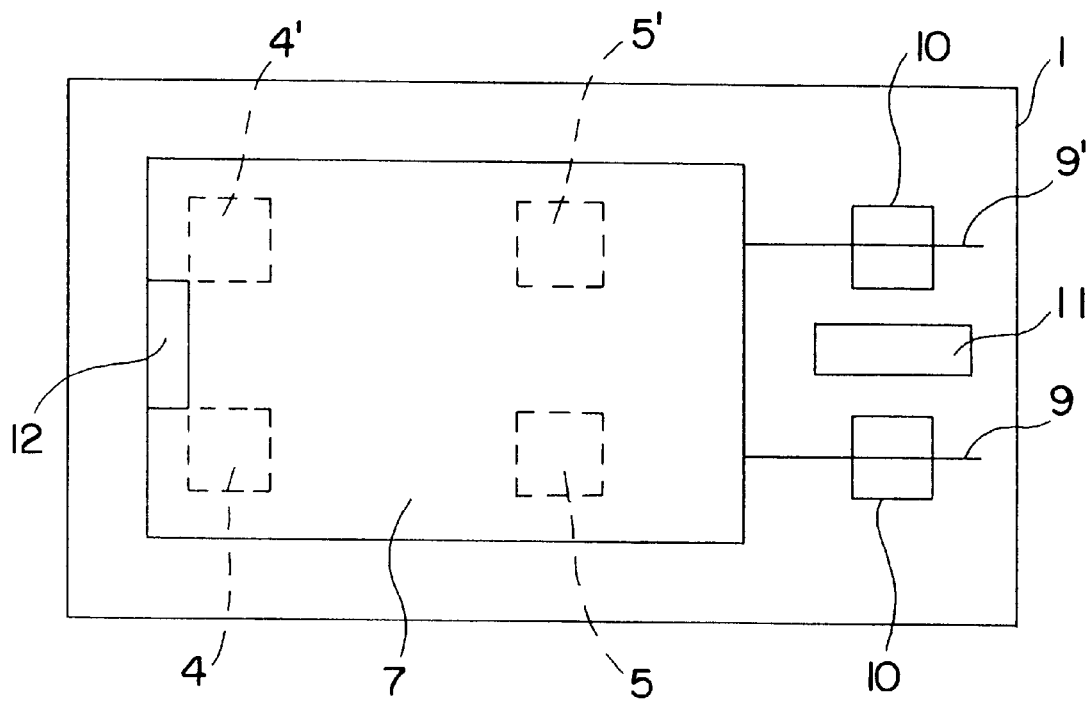

FIGS. 1(a) and 1(b) are configuration diagrams of a main portion of a crystal resonator for showing one embodiment of the present invention; FIG. 1 (a) is a side view and FIG. 1 (b) is a top plan view.

In FIGS. 1(a) and 1(b), an oscillation circuit 2 and a temperature controlling circuit 3 are provided on the lower surface of a printed substrate 1. Six surface mount compact heaters 4, 4', 5, 5', 6 and 6' are disposed with a distance between adjacent heaters on the upper surface of the printed substrate 1.

The compact heaters 4, 4', 5 and 5' are closely adhered to between a metal cap 8 of a crystal resonator 7 and the substrate 1, respectively. The compact heaters 6 and 6' are closely adhered to between lead terminals 9 and 9' of the crystal a resonator 7 and the printed substrate 1 via a metal piece 10. The six compact heaters 4, 4', 5, 5', 6 and 6' are electrically connected to the temperature controlling circuit.

A temperature sensor 11 is disposed on the printed substrate 1 between the compact heaters 6 and 6', and the temperature sensor 11 is electrically connected to the temperature controlling circuit 3. Further, a power transistor 12 for controlling the temperature is closely adhered to the cap 8 and is also used as an auxiliary heat source. In addition, the printed substrate 1 and parts provided thereon are covered with a heat shielding material (not shown) or may be accommodated in a package, according to the need.

The operation of the crystal oscillator having the above-described configuration will be explained next.

When power is supplied to the crystal oscillator, the crystal resonator starts vibration in a frequency based on a resonance frequency of the crystal resonator. The temperature controlling circuit 3 supplies power to the six compact heaters so that a temperature detected by the temperature sensor 11 coincide with a set temperature.

The compact heaters 4, 4', 5 and 5' heat the metal cap 8 so that a crystal blank is warmed by the heat radiated from the metal cap 8. The compact heaters 6 and 6' heat the lead terminals 9 and 9' so that the crystal blank is warmed directly by the heat propagated through the lead terminals 9 and 9'. While the six compact heaters heat the printed substrate 1, the power transistor 12 also warms the crystal resonator 7 through the metal cap 8.

Figure 2:
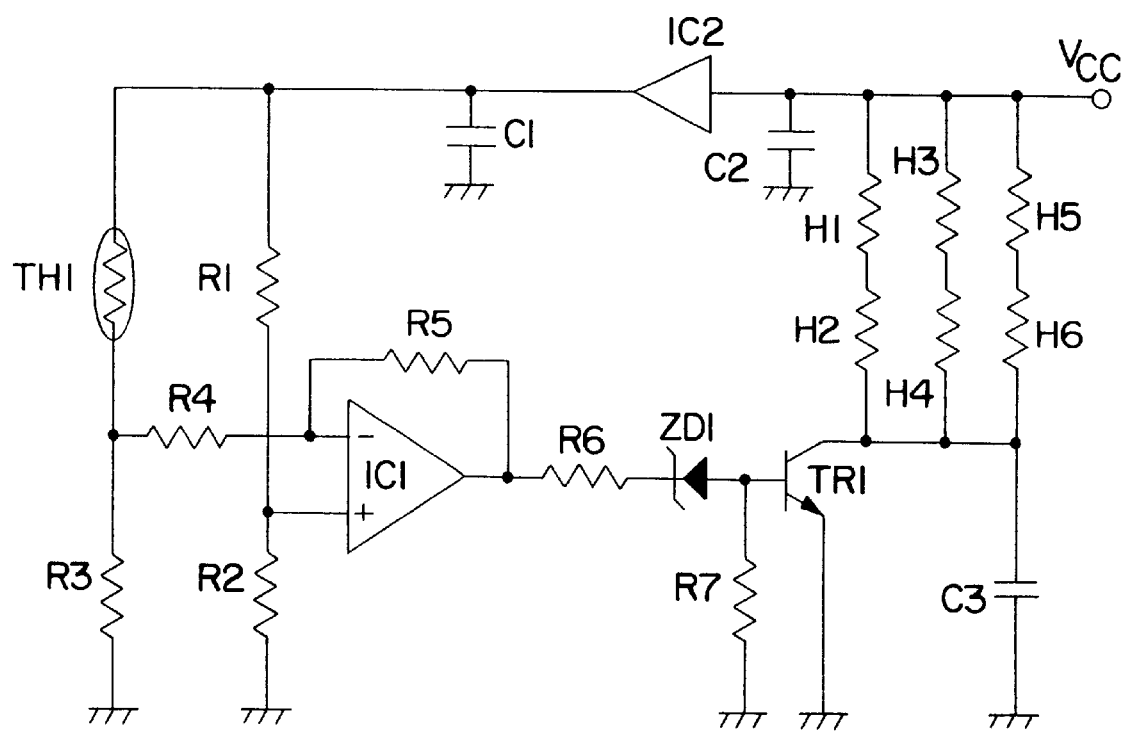
FIG. 2 is a circuit diagram for showing one embodiment of a temperature controlling circuit to be used in a crystal resonator based on the present invention.

FIG. 2 shows one example of the temperature controlling circuit 3.

Resistors R1 and R2 are connected in series, and the center of this connection is connected to a plus-side input of a differential amplifier IC1.

A thermistor TH1 and a resistor R3 for structuring the temperature sensor 11 are connected in series, and the center of this connection is connected to a minus-side input of the differential amplifier IC1 through a resistor R4.

The other terminals of the resistor R1 and the thermistor TH1 respectively are connected to a power supply element IC2, and the respective other terminals of the resistors R2 and R3 are grounded. A feedback resistor R5 is connected between an output of the differential amplifier IC1 and a minus-side input thereof.

A series circuit of a heater H1 and H2, a series circuit of a heater H3 and H4, and a series circuit of a heater H5 and H6 are connected respectively to between the collector of the transistor TR1 and a power supply Vcc.

C1, C2 and C3 connected between the collector of the transistor TR1 and the ground and between the input and output terminals of the power supply element IC2 and the ground respectively are bypass capacitors.

The operation of the temperature controlling circuit 3 shown in FIG. 2 will be explained next.

The differential amplifier outputs a voltage corresponding to a voltage difference between the plus-side input and the minus-side input. As a resistance value of the thermistor TH1 becomes higher when the temperature is lower, a voltage difference between the plus-side input and the minus-side input of the differential amplifier IC1 becomes larger, and an output voltage of the differential amplifier becomes higher.

Since the base voltage of the transistor TR1 increases, each of the heaters H1, H2, H3, H4, H5 and H6 is heated.

In this figure, a Zener diode ZD1 is for determining a lowest voltage at which the transistor TR1 operates.

In this crystal resonator, the heat capacity and the radiation amount of the metal cap 8 of the crystal resonator 7 is different from that of the lead terminal 9 of the crystal resonator 7.

That is, when the metal cap 8 is heated, the crystal blank is mainly heated by the radiant heat from the metal cap 8. On the other hands, when the lead terminal 9 is heated, the crystal blank is mainly heated by a transmitting heat from the lead terminal to the crystal blank.

In general, the crystal blank receives a larger influence of temperature from the heat given by the lead terminal 9 than from the heat given by the metal cap 8.

Accordingly, in consideration of the influence on the temperature of the crystal blank, it becomes possible to control a current flowing to each heater and hence to improve the heating efficiency as well as to restrict variation in the temperature of the crystal resonator 7 due to the influence of the outer temperature, by individually setting the heat generation level of each of the compact heaters 4, 4', 5, 5', 6 and 6', that is, by combining the heaters of different heat generation levels or by inserting desired resistors in the series circuit of each heater by using the heaters of the same heat generation level.

In the present embodiment, it has been explained that the metal cap 8 of the crystal resonator 7, the lead terminals 9 and 9' and the compact heaters 4, 4', 5, 5', 6 and 6' are directly contacted or are closely adhered via the metal plate 10. However, it is also good to fix these by adhesion by using an adhesive or the like of excellent heat conductivity.

Further, although the six compact heaters are used in the above explanation, the present invention is not limited to this number, and it is needless to mention that, even if the number of compact heaters used is less than six or more than six, it is possible to obtain an equivalent operation to that of the present embodiment by setting the heating capacity of the individual compact heaters so as to heat stably the vibrator and the printed substrate.

Figure 3A:
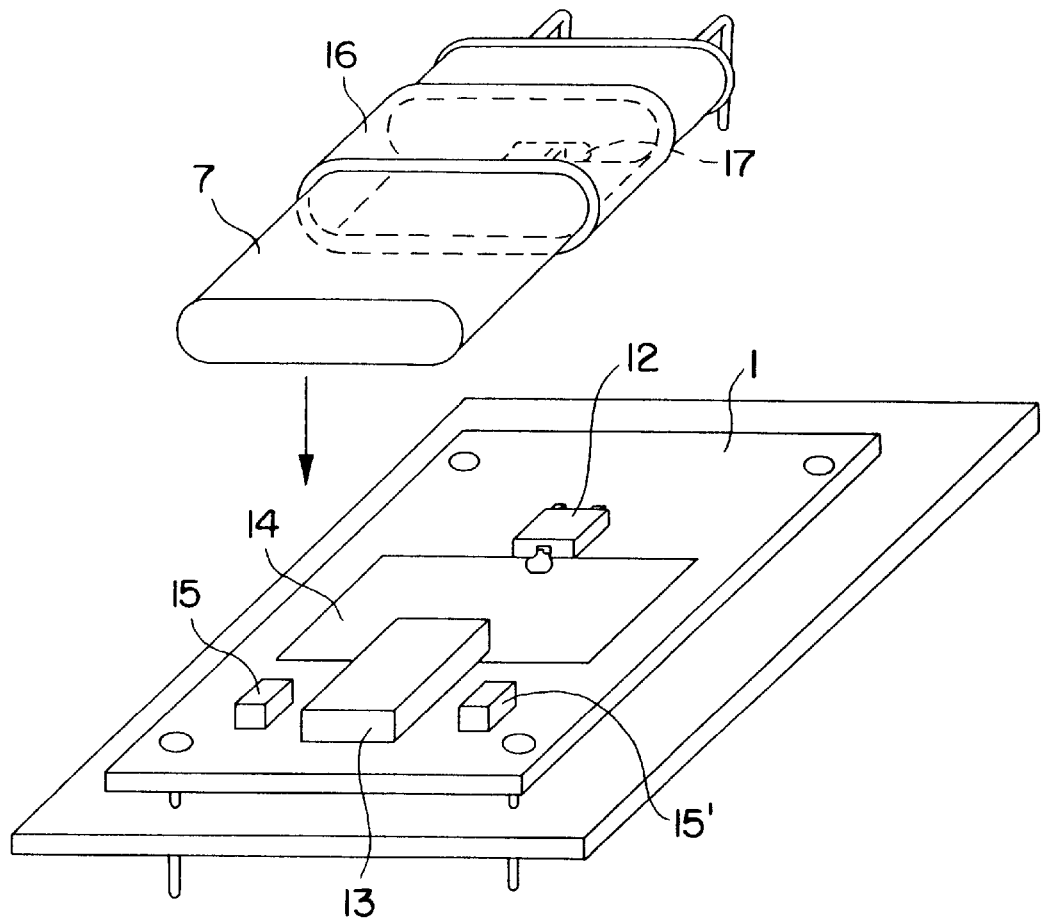
FIG. 3 (a) is a view for showing a exploded configuration of another embodiment of a crystal resonator based on the present invention, and FIG. 3 (b) is a cross-sectional view for showing a side configuration of the same.
Figure 3B:
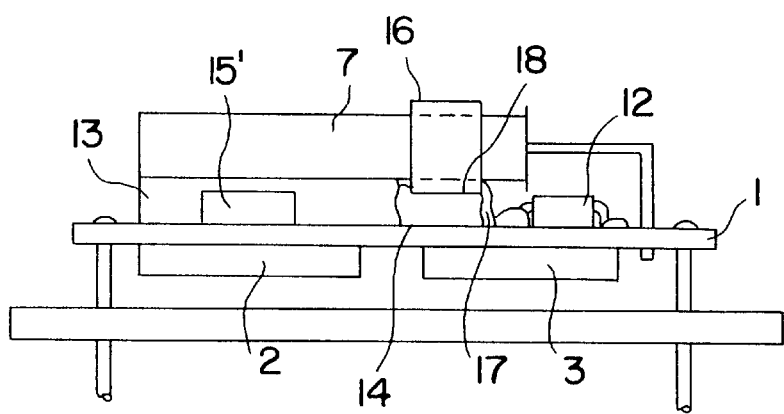

FIGS. 3 (*a*) and 3 (*b*) are configuration diagrams for showing another embodiment of a crystal resonator based on the present invention which is provided to have a reduced number of compact heaters in order to further minimize power consumption as compared with the crystal resonator explained in the above.

FIGS. 3 (*a*) and (*b*) are an exploded perspective view and a cross-sectional view of the configuration of the crystal resonator, respectively.

In this embodiment, a surface mount compact heater 13 is provided on the upper surface of a printed substrate 1, and one terminal of the compact heater 13 is connected to a land pattern 14 of a wide area provided on the printed substrate 1, as shown in the drawings. Further, a collector terminal of a power transistor 12 electrically connected to the compact heater 13 is connected to the land pattern 14.

As shown in FIG. 3 (*a*), a thermistor 15 and a thermistor 15' are disposed as heat-sensitive elements on both sides of the compact heater 13, with an equal distance between the heater and each thermistor.

As shown in FIG. 3 (*b*), other electronic parts for structuring an oscillation circuit 2, a temperature controlling circuit 3 and the like are disposed, for example, on the back surface of the substrate 1.

A crystal resonator 7 is fixed in a metal support 16, and a terminal 17 stretching downward is provided at a part of the periphery of the support 16. The terminal 17 is provided at a position corresponding to the land pattern 14 when the crystal resonator 7 is provided on the printed substrate 1, and is connected to the land pattern 14 by solder or the like having excellent heat conductivity.

In this case, the crystal resonator 7 is disposed so as to have a close adhesion to the upper surface of the heater 13. Finally, a resin adhesive 18 with excellent heat conductivity is filled between the crystal resonator 7 and the printed substrate 1. A consideration is given to insulate the collector of the transistor 12 from the earth.

Figure 4:
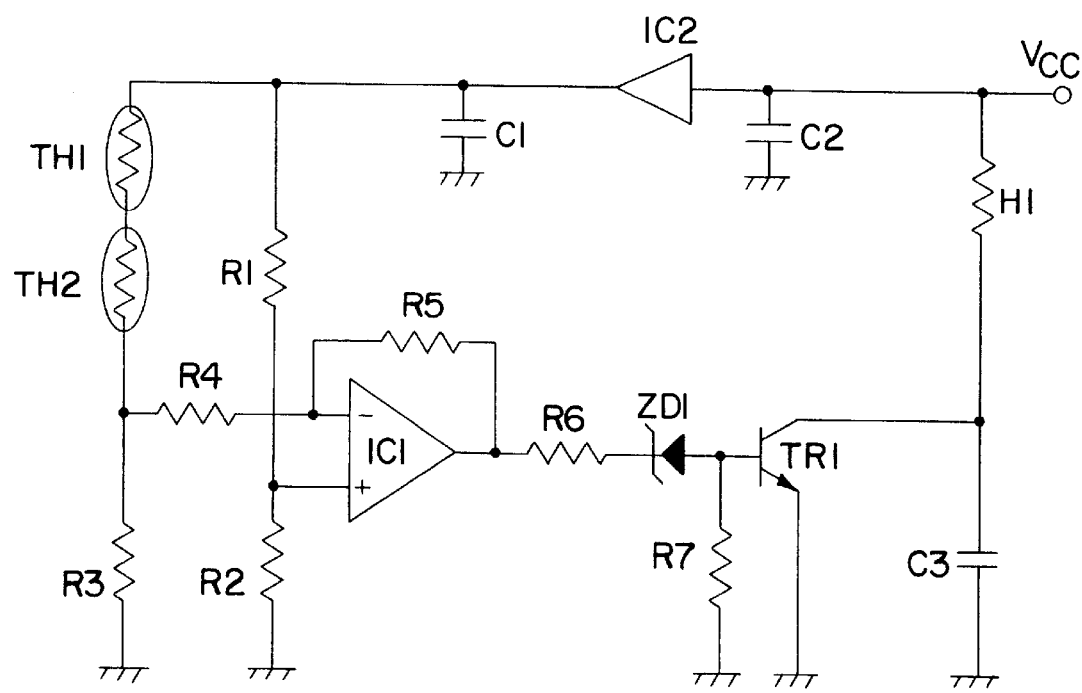
FIG. 4 is a circuit diagram for showing one embodiment of a temperature controlling circuit to-be used in another embodiment of a crystal resonator based on the present invention.
Figure 5:
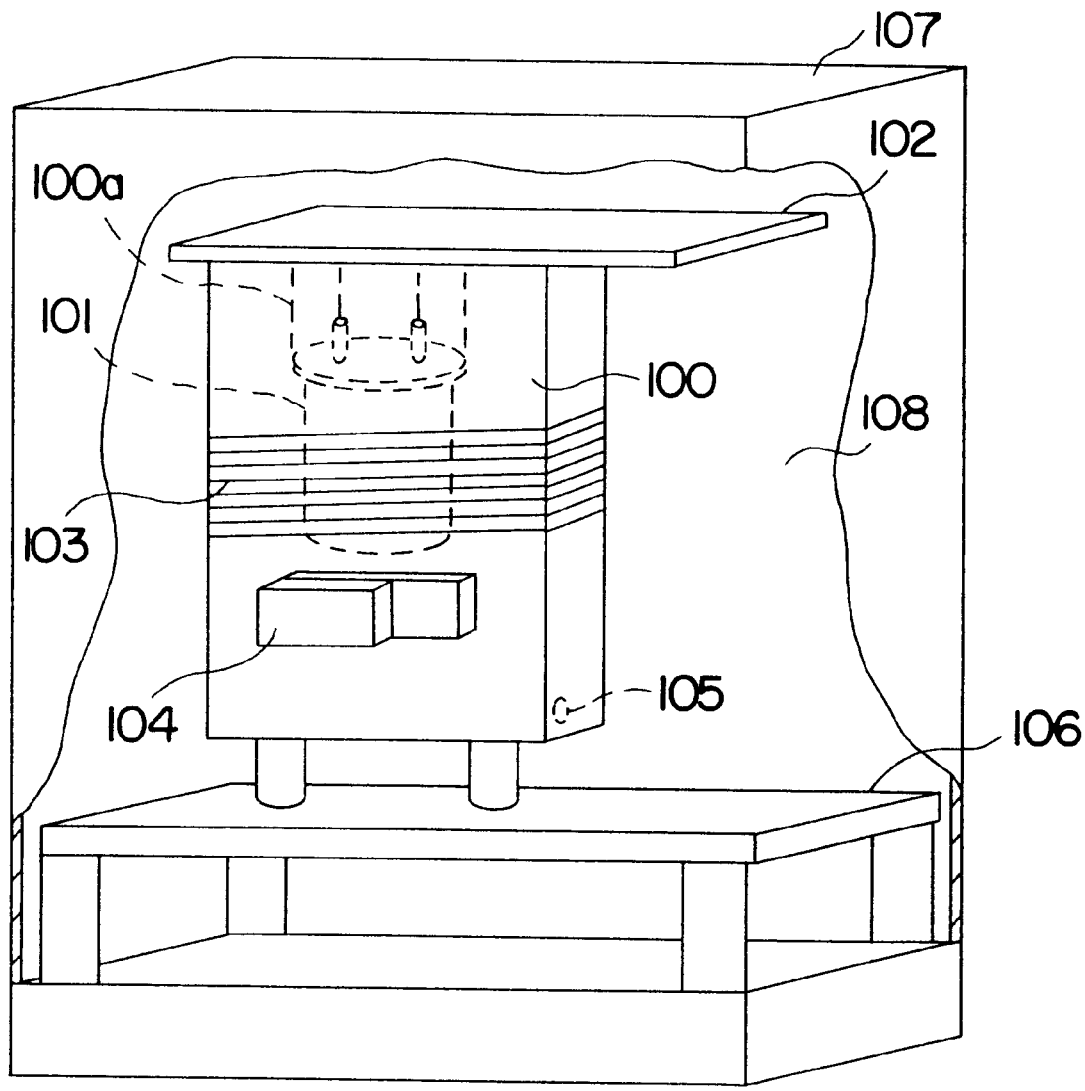
FIG. 5 is a view for showing a configuration of a conventional crystal resonator.

FIG. 4 is a circuit diagram for showing once embodiment of a temperature controlling circuit to be used in a crystal resonator disposed with various parts as shown in FIGS. 3(*a*) and 3(*b*).

In FIG. 4, a thermistor TH1 and a thermistor TH2 correspond to 15 and 15' respectively in FIGS. 3(*a*) and 3(*b*), a power transistor TR1 corresponds to 12 in FIG. 3(*a*) and 3(*b*), and a heater H1 connected to the collector of the power transistor R1 corresponds to 13 in FIGS. 3(*a*) and 3(*b*).

With the above arrangement, heat from the compact heater 13 is directly transmitted from the lower side of the crystal resonator 7, and the land pattern 14 is heated by the compact heater 13 and by the collector of the power transistor 12. Further, this heat is efficiently transmitted to the crystal resonator 7 over a wide range of area through the terminal 17 provided on the support 16 and through the resin adhesive 18.

In other words, in order to efficiently utilize the heat of the power transistor 12 as the auxiliary heat source, the wide-area land pattern 14 and the resin adhesive 18 are used to transmit the heat to the crystal resonator 7. Further, the thermistors 15 and 15' are disposed on both sides of the crystal resonator 7 to have an increased number of temperature detecting points to make it possible to carry out the temperature control of high sensitivity. Accordingly, it is possible to heat the crystal resonator 8 sufficiently even by the heating using a small number of compact heaters. Thus, a crystal resonator having a frequency of high stability can be realized.

Although description has been made of the structure for heating only the case of the crystal resonator in FIGS. 3(*a*) and 3(*b*), it is also possible to provide a structure for heating the lead terminal of the crystal resonator at the same time. In this case, it is desirable to employ the structure of using the compact heaters and the metal piece as explained in FIGS. 1(*a*) and 1(*b*), or the structure of covering with the resin adhesive to have an efficient transmission of the heat from the power transistor as explained in FIGS. 3(*a*) and 3(*b*).

Although the thermistor elements are used as the temperature sensors in the explanation of the above embodiment, the present invention is not limited to this, and it is also possible to use other semiconductor elements such as semiconductor sensors or the like as the temperature sensors.

As explained above, according to the first aspect of the invention, as the resonator is heated directly by the surface mount heater without using a thermostatic bath of metal or the like, there is an effect of easily providing a compact and low cost apparatus.

Further, as there is employed the structure of heating the lead terminal by installing the compact heaters for direct transmission of the heat to the crystal blank without using a metal block, the heating capacity is decreased, and the oscillator can achieve low power consumption. There is also an effect of making shorter the starting time from when the power supply is turned on till the frequency is stabilized.

According to the second aspect of the invention, as there is employed the structure of transmitting the heat of the power transistor as the auxiliary heat source to the wide-area land pattern and further transmitting the heat transmitted to the land pattern to the piezoelectric resonator, there is an effect of effectively transmitting the heat of the power transistor to the piezoelectric resonator. Accordingly, it is possible to use compact heaters of small heat capacity as the main heating elements for heating the piezoelectric resonator. This has an effect that the piezo-oscillator achieves low power consumption.

According to the third aspect of the invention, as there is employed the structure of transmitting the heat of the power transistor as the auxiliary heat source to the wide-area land pattern and further transmitting the heat transmitted to the land pattern to the piezoelectric resonator, there is an effect of effectively transmitting the heat of the power transistor to the piezoelectric resonator. Accordingly., it is possible to use compact heaters of small heat capacity as the main heating elements for heating the piezoelectric resonator. This has an effect that the piezo-oscillator achieves low power consumption. In addition to the above, as there is employed the structure of heating the lead terminal by installing the compact heaters for direct transmission of the heat to the crystal blank without using a metal block, the heating capacity is decreased, and the oscillator can achieve low power consumption. There is also an effect of making shorter the rise time from when the power supply is turned on till the frequency is stabilized.

According to the fourth aspect of the invention, there are the same effects as those of the first aspect of the invention. In addition, as the crystal resonator and the lead terminals are directly heated in good balance by the individual heaters, there is an effect of being able to provide a structure of the oscillator with excellent starting characteristics that the oscillation frequency is stabilized in short time against a temperature variation.

According to the fifth aspect of the invention, there are the same effects as those of the second aspect of the invention. In addition, as the crystal resonator and the lead terminals are directly heated in good balance by the individual heaters, there is an effect of being able to provide a structure of the oscillator with excellent starting characteristics that the oscillation frequency is stabilized in short time against a temperature variation.

According to the sixth aspect of the invention, there are the same effects as those of the third aspect of the invention. In addition, as the crystal resonator and the lead terminals are directly heated in good balance by the individual heaters, there is an effect of being able to provide a structure of the oscillator with excellent starting characteristics that the oscillation frequency is stabilized in short time against a temperature variation.

According to the seventh aspect of the invention, there are the same effects as those of the second aspect of the invention. In addition, as there is employed the structure of transmitting the heat of the power transistor as the auxiliary heat source to the wide-area land pattern and further transmitting the heat transmitted to the land pattern to the piezoelectric resonator, there is an effect of effectively transmitting the heat of the power transistor to the piezoelectric resonator. Accordingly, it is possible to obtain a frequency of sufficient stability by heating using a small number of heaters. This has an effect that the piezo-oscillator achieves low power consumption.

According to the eighth aspect of the invention, there are the same effects as those of the third aspect of the invention. In addition, as there is employed the structure of transmitting the heat of the power transistor as the auxiliary heat source to the wide-area land pattern and further transmitting the heat transmitted to the land pattern to the piezoelectric resonator, there is an effect of effectively transmitting the heat of the power transistor to the piezoelectric resonator. Accordingly, it is possible to obtain a frequency of sufficient stability by heating using a small number of heaters. This has an effect that the piezo-oscillator achieves low power consumption.

According to the ninth aspect of the invention, there are the same effects as those of the fifth aspect of the invention. In addition, as there is employed the structure of transmitting the heat of the power transistor as the auxiliary heat source to the wide-area land pattern and further transmitting the heat transmitted to the land pattern to the piezoelectric resonator, there is an effect of effectively transmitting the heat of the power transistor to the piezoelectric resonator. Accordingly, it is possible to obtain a frequency of sufficient stability by heating using a small number of heaters. This has an effect that the piezo-oscillator achieves low power consumption.

According to the tenth aspect of the invention, there are the same effects as those of the sixth aspect of the invention. In addition, as there is employed the structure of transmitting the heat of the power transistor as the auxiliary heat source to the wide-area land pattern and further transmitting the heat transmitted to the land pattern to the piezoelectric resonator, there is an effect of effectively transmitting the heat of the power transistor to the piezoelectric resonator. Accordingly, it is possible to obtain a frequency of sufficient stability by heating using a small number of heaters. This has an effect that the piezo-oscillator achieves low power consumption.

According to the eleventh aspect of the invention, there are the same effects as those of the first aspect of the invention. In addition, as the resin is filled between the printed substrate to be heated and the crystal resonator, the heat of the heaters is transmitted efficiently to the crystal resonator, so that the heating can be achieved by using a small number of heaters or by using compact heater of small heat capacity. This has an effect that the piezo-oscillator achieves low power consumption.

According to the twelfth aspect of the invention, there are the same effects as those of the fourth aspect of the invention. In addition, as the resin is filled between the printed substrate to be heated and the crystal resonator, the heat of the heaters is transmitted efficiently to the crystal resonator, so that the heating can be achieved by using a small number of heaters or by using compact heater of small heat capacity.

This has an effect that the piezo-oscillator can achieve low power consumption.

What is claimed is:

1. A piezo-oscillator having disposed on a printed substrate a piezoelectric resonator, an oscillation circuit, at least one surface mount heater and a temperature controlling circuit for controlling a heating temperature of the heater, wherein a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time.

2. A piezo-oscillator having disposed on a printed substrate a piezoelectric resonator, an oscillation circuit, at least one heater and a temperature controlling circuit for controlling a heating temperature of the heater, wherein the temperature controlling circuit is equipped with a temperature sensitive element and a DC control transistor; a wide-area land pattern for connecting a collector terminal of the transistor is provided on a first main surface of the printed substrate; and at least the transistor, the heater and the temperature sensitive element are disposed on the first main surface of the printed substrate; with the piezoelectric resonator being disposed to cover both the temperature sensitive element and the heater; and with the piezoelectric element and the land pattern being connected together via a heat conductive member disposed therebetween.

3. A piezo-oscillator having disposed on a printed substrate a piezoelectric resonator, an oscillation circuit, at least one heater and a temperature controlling circuit for controlling a heating temperature of the heater, wherein the temperature controlling circuit is equipped with a temperature sensitive element and a DC control transistor; a wide-area land pattern for connecting a collector terminal of the transistor is provided on a first main surface of the printed substrate; at least the transistor, the heater and the temperature sensitive element are disposed on the first main surface of the printed substrate; and a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time; with the piezoelectric element and the land pattern being connected together via a heat conductive member disposed therebetween.

4. A piezo-oscillator having disposed on a printed substrate a piezoelectric resonator, an oscillation circuit, at least one surface mount heater and a temperature controlling circuit for controlling a heating temperature of the heater, wherein a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time; and a rate of power supply to the individual heaters is set to stabilize the oscillation frequency of the oscillator according to a difference of heat capacity of the piezoelectric resonator.

5. A piezo-oscillator having disposed on a printed substrate a piezoelectric resonator, an oscillation circuit, at least one heater and a temperature controlling circuit for controlling a heating temperature of the heater, wherein the temperature controlling circuit is equipped with a temperature sensitive element and a DC control transistor; a rate of power supply to the individual heaters is set to stabilize the oscillation frequency of the oscillator according to a difference of heat capacity of the piezoelectric resonator; a wide-area land pattern for connecting a collector terminal of the transistor is provided on a first main surface of the printed substrate; and at least the transistor, the heater and the temperature sensitive element are disposed on the first main surface of the printed substrate; with the piezoelectric resonator being disposed to cover both the temperature sensitive element and the heater; and with the piezoelectric element and the land pattern being connected together via a heat conductive member disposed therebetween.

6. A piezo-oscillator having disposed on a printed substrate a piezoelectric resonator, an oscillation circuit, at least one surface mount heater and a temperature controlling circuit for controlling a heating temperature of the heater, wherein the temperature controlling circuit is equipped with a temperature sensitive element and a DC control transistor; a rate of power supply to the individual heaters is set to stabilize the oscillation frequency of the oscillator according to a difference of heat capacity of the piezoelectric resonator; a wide-area land pattern for connecting a collector terminal of the transistor is provided on a first main surface of the printed substrate; at least the transistor, the heater and the temperature sensitive element are disposed on the first main surface of the printed substrate; and a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time; with the piezoelectric element and the land pattern being connected together via a heat conductive member disposed therebetween.

7. A piezo-oscillator having disposed on a printed substrate a piezoelectric resonator, an oscillation circuit, at least one surface mount heater and a temperature controlling circuit for controlling a heating temperature of the heater, wherein the temperature controlling circuit is equipped with a temperature sensitive element and a DC control transistor; a wide-area land pattern for connecting a collector terminal of the transistor is provided on a first main surface of the printed substrate; at least the transistor, the heater and the temperature sensitive element are disposed on the first main surface of the printed substrate; with the piezoelectric resonator being disposed to cover both the temperature sensitive element and the heater; and with the piezoelectric element and the land pattern being connected together via a metal plate and a heat conductive member disposed therebetween.

8. A piezo-oscillator having disposed on a printed substrate a piezoelectric resonator, an oscillation circuit, at least one heater and a temperature controlling circuit for controlling a heating temperature of the heater, wherein the temperature controlling circuit is equipped with a temperature sensitive element and a DC control transistor; a wide-area land pattern for connecting a collector terminal of the transistor is provided on a first main surface of the printed substrate; and at least the transistor, the heater and the temperature sensitive element are disposed on the first main surface of the printed substrate; and a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time; with the piezoelectric element and the land pattern being connected together via a metal plate and a heat conductive member disposed therebetween.

9. A piezo-oscillator having disposed on a printed substrate a piezoelectric resonator, an oscillation circuit, at least one heater and a temperature controlling circuit for controlling a heating temperature of the heater, wherein the temperature controlling circuit is equipped with a temperature sensitive element and a DC control transistor; a rate of power supply to the individual heaters is set to stabilize the oscillation frequency of the oscillator according to a difference of heat capacity of the piezoelectric resonator; a wide-area land pattern for connecting a collector terminal of the transistor is provided on a first main surface of the printed substrate; and at least the transistor, the heater and the temperature sensitive element are disposed on the first main surface of the printed substrate; with the piezoelectric resonator being disposed to cover both the temperature sensitive element and the heater; and with the piezoelectric element and the land pattern being connected together via a metal plate and a heat conductive member disposed therebetween.

10. A piezo-oscillator having disposed on a printed substrate a piezoelectric resonator, an oscillation circuit, at least one heater and a temperature controlling circuit for controlling a heating temperature of the heater, wherein the temperature controlling circuit is equipped with a temperature sensitive element and a DC control transistor; a rate of power supply to the individual heaters is set to stabilize the oscillation frequency of the oscillator according to a difference of heat capacity of the piezoelectric resonator; a wide-area land pattern for connecting a collector terminal of the transistor is provided on a first main surface of the printed substrate; and at least the transistor, the heater and the temperature sensitive element are disposed on the first main surface of the printed substrate; and a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time; with the piezoelectric element and the land pattern being connected together via a metal plate and a heat conductive member disposed therebetween.

11. A piezo-oscillator having disposed on a printed substrate a piezoelectric resonator, an oscillation circuit, at least one surface mount heater and a temperature controlling circuit for controlling a heating temperature of the heater, wherein a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time; with a heat conductive member filled between the piezoelectric element and the printed substrate.

12. A piezo-oscillator having disposed on a printed substrate a piezoelectric resonator, an oscillation circuit, at least one surface mount heater and a temperature controlling circuit for controlling a heating temperature of the heater, wherein a case of the piezoelectric resonator and a lead terminal of the piezoelectric resonator are heated respectively at the same time by individually separate heaters for the purpose of heating the piezoelectric resonator, the oscillation circuit and the temperature controlling circuit at the same time; and a rate of power supply to the individual heaters is set to stabilize the oscillation frequency of the oscillator according to a difference of heat capacity of the piezoelectric resonator; with a heat conductive member filled between the piezoelectric element and the printed substrate.

* * * * *